United States Patent [19]

Abe et al.

[11] 4,110,840
[45] Aug. 29, 1978

[54] SENSE LINE CHARGING SYSTEM FOR RANDOM ACCESS MEMORY

[75] Inventors: Kichio Abe, Yokohama, Japan; William L. Martino, Jr., Austin, Tex.

[73] Assignee: Motorola Inc., Schaumburg, Ill.

[21] Appl. No.: 753,235

[22] Filed: Dec. 22, 1976

[51] Int. Cl.$^2$ .............................................. G11C 7/00
[52] U.S. Cl. .............................. 365/203; 307/DIG. 3; 365/154
[58] Field of Search ...................... 340/173 FF, 173 R; 365/154, 203; 307/DIG. 3

[56] References Cited

U.S. PATENT DOCUMENTS

| | | | |
|---|---|---|---|
| 3,609,712 | 9/1971 | Dennard | 340/173 FF |
| 3,638,039 | 1/1972 | Chen et al. | 340/173 FF |
| 3,936,810 | 2/1976 | Dunn | 340/173 R |
| 4,006,469 | 2/1977 | Leehan et al. | 340/173 R |

*Primary Examiner*—Stuart N. Hecker
*Attorney, Agent, or Firm*—Joe E. Barbee

[57] ABSTRACT

A random access memory includes a column of static MOS storage cells. Two sense-write conductors are coupled to each cell in the column. Each sense-write conductor is also coupled, respectively, to a termination MOSFET. The first sense-write conductor of each column of storage cells is coupled by means of a first coupling MOSFET to a first bit-sense conductor. The second sense-write conductor of each column of storage cells is coupled, by a second MOSFET to a second bit-sense conductor. Each pair of sense-write conductors is coupled to a $V_{DD}$ conductor by a separate charging MOSFET having its gate electrode coupled to a circuit for generating a pulse at the end of a write cycle. Since at the end of any write operation, the two bit-sense conductors and the two sense-write conductors of the selected column will be at opposite voltage levels, the pulse very rapidly precharges the voltages of the two sense-write conductors and of the two bit-sense conductors to levels which ensure that the data stored in the storage cell next selected will not be destroyed as a result of the opposite voltage levels of the two bit-sense conductors acting to write an undesired state into the storage cell selected next. The read access time of the memory is reduced by the amount of time required by the termination MOSFETS to charge a sense-write conductor and a bit-sense conductor to a MOSFET threshold drop below $V_{DD}$ minus the time required for the charging MOSFETs to precharge the sense-write and bit-sense conductors.

6 Claims, 4 Drawing Figures

SENSE LINE CHARGING SYSTEM FOR RANDOM ACCESS MEMORY

BACKGROUND OF THE INVENTION

2. Field of the Invention

The invention relates to static MOS random access memories.

2. Brief Description of the Prior Art

Static MOS RAM's are commonly implemented utilizing six transistor storage cells. For example, see U.S. Pat. No. 3,594,736. The six-transistor storage cells are each comprised of cross-coupled back-to-back inverters. The outputs of each inverter are also connected, respectively, to two isolation MOSFETs. Each isolation MOSFET is coupled, respectively, to a separate sense-write conductor which has a substantial parasitic capacitance associated therewith. In a memory system, each sense-write conductor is coupled to the source of a separate termination MOSFET. Each termination MOSFET has its gate and source connected to a $V_{DD}$ conductor. Each of the storage cells is coupled between $V_{DD}$ and ground. In order to obtain low cost semiconductor RAMs, it is necessary that the storage cells be as small in size as possible. This requirement prevents the respective storage cells from being able to sink much sense current when they are selected during a read operation. At the beginning of a read operation, the two sense-write conductors coupled to the selected cell should *both* be at voltages equal to approximately one MOSFET threshold voltage drop below $V_{DD}$ in order to avoid the next selected storage cell having the same state written into it as was written into the last selected storage cell during the just completed write cycle. In order to avoid the information stored in the next storage cell from being destroyed, the read cycle following a write cycle must not begin until the sense-write lines have recovered from the previous write cycle. The sense-write conductor which was driven to approximately zero volts during the write cycle recovers by being charged up through its termination MOSFET. But the termination MOSFETs are normally designed to be high impedance devices in order to avoid loading the write circuit during writing and to avoid loading the selected storage cell during sensing. Consequently, the access times of MOS static random access memories are relatively slow.

SUMMARY OF THE INVENTION

It is an object of this invention to reduce the access time of a static MOS RAM.

It is another object of the invention to provide a circuit which rapidly charges the sense-write conductors and bit-sense conductors of a MOS RAM prior to a sensing operation.

Briefly described, the invention comprises a pair of charging MOSFETs having their current-carrying electrodes coupled, respectively, between each one of a pair of sense-write conductors associated with a column of static storage cells and a voltage conductor. The gate electrodes of the charging MOSFETs are coupled to a circuit which senses the end of a write operation on the beginning of a read operation and generates a pulse of duration sufficient to turn on the charging MOSFETs long enough to establish the voltages of the two sense-write conductors to values which ensure that data will not be destroyed in the next sensed storage cell.

DESCRIPTION OF THE INVENTION

Figure 1:
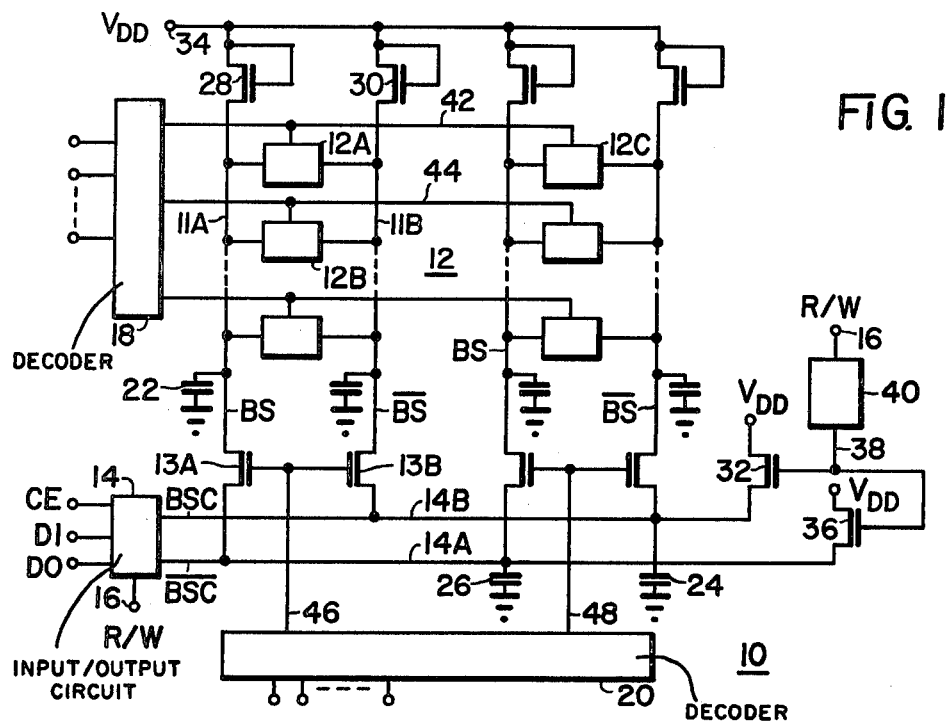
FIG. 1 is partial schematic drawing of a preferred embodiment of the invention.
Figure 4:
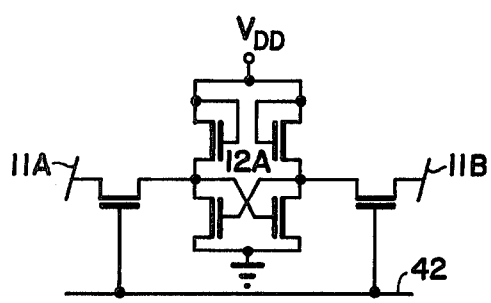
FIG. 4 is a schematic diagram of one of the static storage cells of FIG. 1.

Referring to FIG. 1, memory 10 includes a plurality of rows and columns of memory cells such as 12A, 12B, 12C, etc. Each of the cells is a six-transistor static memory cell such as the one shown in U.S. Pat. No. 3,594,736. FIG. 4 shows such a static storage cell, which is very well known in the art. Each column of storage cells shares a pair of sense-write conductors such as 11A and 11B. The sense-write conductors are utilized to write information into the selected storage cell and sense information out of the selected storage cell during a read cycle. A storage cell is selected by means of a selection conductor such as conductor 42, which is coupled to address decode circuit 18. Each sense-write conductor has a relatively large (compared to the node capacitances of one of the storage cells) parasitic capacitance such as 22 associated therewith. Each sense-write conductor also has a termination MOSFET such as 28 or 30 connected thereto. The gate and drain of each termination MOSFET is connected to $V_{DD}$ voltage supply conductor 34.

A particular column of storage cells is selected by means of a pair of selection MOSFETs such as 13A and 13B. The selection MOSFET is coupled between a sense-write conductor and a bit-sense conductor which is coupled to an input-output circuit 14. The gates of each pair of selection MOSFETs assoicated with a particular column of cells are coupled to a column address decoder 20. Each bit-sense conductor has a relatively large parasitic capacitance such as 26 or 24 associated therewith. The above-mentioned parasitic capacitances are so large compared to the storage cell node capacitances that if a storage cell having stored a logic state opposite to the logic state sensed from or written into another storage cell in the same column during the previous memory cycle is selected by a fast-rise-time selection pulse, the data in the former cell will be destroyed. This is because during either a reading operation or a writing operation, the sense-write conductors associated with the selected column are at opposite logic levels for a period of time, as are the bit-sense conductors coupled thereto by means of the column selection MOSFETs 13A, 13B. The large parasitic capacitance act as low-impedance driver or write circuits to the sense-write conductors and the bit-sense conductors.

Bit-sense conductor 14A is connected to the source of a charging MOSFET 36, which has its drain connected to $V_{DD}$. Bit-sense conductor 14B is connected to a source of charging MOSFET 32 which has its drain connected to $V_{DD}$. The gates of charging MOSFETs 32 and 36 are connected to conductor 38, which is electrically driven by circuit 40.

Figure 2:
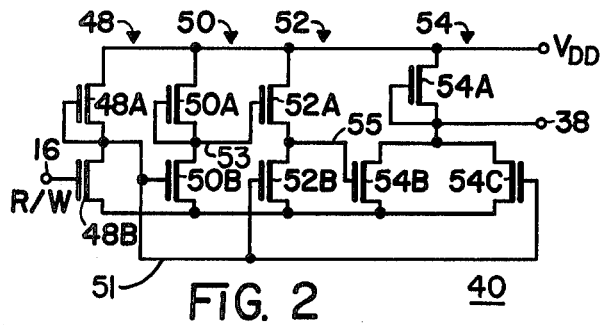
FIG. 2 is a schematic diargram of circuit 40 of FIG. 1.

Referring to FIG. 2, circuit 40 includes an inverter 48 having its input 16 connected to the R/W (read/write) input of memory 10. The output 51 of inverter 48 is connected to inputs of inverter 50, driver circuit 52, and NOR gate 54. The output of inverter 50 is connected to the gate of load MOSFET 52A of driver circuit 52. The output of driver circuit 52 is connected to the other input of NOR gate 54. The output of NOR gate 54 is connected to conductor 38.

Figure 3:
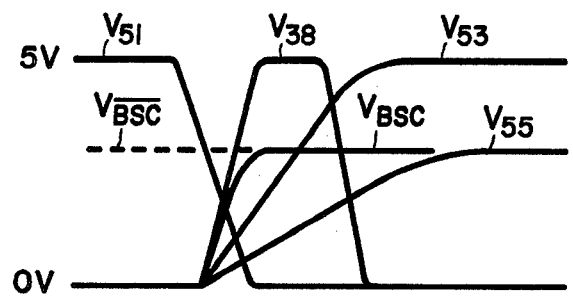
FIG. 3 is a graph showing the waveforms of the circuits of FIGS. 1 and 2.

The operation of the memory is described with reference to all three Figures. Initially, column select circuit 20 generates a column selection signal to turn on the column selection MOSFETs of the selected column. For example, column selection circuit 20 may generate a selection signal on conductor 46, which turns on column selection MOSFETs 13A and 13B, so that the sense-write conductors 11A and 11B are electrically coupled to bit-sense conductors 14A and 14B, respectively. If a write operation has just been completed, sense-write conductor 11A and bit-sense conductor 14A will be at opposite logic levels from conductors 11B and 14B, respectively. Assume, for example, that sense-write conductor 11A and bit-sense conductor 14A are at zero volts and that sense-write conductor 11B and bit-sense conductor 14B are at $V_{DD}$. The next thing that happens is that a read/write signal applied to conductor 16 goes from a logical "0" to a logical "1" in order to initiate a read operation. MOSFET 48B is turned on, and the voltage at node 51 goes from $V_{DD}$ (which is assumed to be 5 volts for the waveform shown in FIG. 3) to zero volts, as indicated by waveform $V_{51}$ in FIG. 3. This causes MOSFETs 50B, 52B and 54C to be turned off. Node 53 rises as indicated by waveform $V_{53}$ in FIG. 3. Since MOSFET 52B is off, node 55 rises as indicated by waveform $V_{55}$. However, as soon as $V_{51}$ had reached zero volts, and MOSFET 54C was turned off, node 38 had started to rise as indicated by the leading edge of waveform $V_{38}$. $V_{38}$ remains at five volts during the delay through inverter 50 and driver 52. Eventually $V_{55}$ rises to a high enough voltage to turn MOSFET 54B on, causing node 38 to be discharged back to zero volts, as indicated by the trailing edge of $V_{38}$ in FIG. 3. Referring to FIG. 1, the positive pulse of $V_{38}$ turns MOSFETs 32 and 36 on, charging bit-sense conductors 14A and 14B to within a threshold voltage drop of $V_{DD}$. Since MOSFETs 13A and 13B are on, sense-write conductors 11A and 11B are also charge to within a threshold voltage of $V_{DD}$. When $V_{38}$ returns to zero volts, MOSFETs 32 and 36 are turned off, and the selected storage cell is electrically coupled to the sense-write conductors 11A and 11B by turning on the isolation MOSFETs of the selected storage cell by means of a row selection pulse applied to the row selection conductor such as 42 or 44 of the selected row. The read operation proceeds uninhibited by MOSFETs 32 and 36, which are in an off condition.

What is claimed is:

1. A memory system comprising:
a plurality of storage cells:
first and second sense-write conductors coupled to a plurality of said storage cells for writing information into and sensing information out of a selected one of said storage cells;
first means coupled to said storage cells for selecting one of said storage cells;
read/write means coupled to said first and second sense-write conductors responsive to a read/write input of said memory system for controlling reading and writing operations in said memory system; and
means responsive to said read/write input coupled to said first and second sense-write conductors for charging said first and second sense-write conductors to substantially equal voltages in response to a transition of said read/write input prior to sensing one of said storage cells.

2. The memory system as recited in claim 1 wherein each of said storage cells is a static storage cell.

3. The memory system as recited in claim 1 further including first and second bit-sense conductors coupling said read/write means and said means responsive to said read/write input to said first and second sense-write conductors, and first and second field effect transistors coupling said first and second sense-write conductors to said first and second bit-sense conductors, respectively, and selection means coupled to gate electrodes of said first and second field effect transistors for electrically coupling said first and second sense-write conductors to said first and second bit-sense conductors, respectively.

4. The memory system as recited in claim 1 wherein said means responsive to said read/write input includes: a two-input NOR gate means having a first input coupled to said read/write input; a delay means having an input coupled to said read/write input and an output coupled to a second input of said NOR gate means for applying a logical "zero" to said second input a predetermined amount of time after a logical "zero" is applied to said first input in response to said read/write input.

5. The memory system as recited in claim 4 wherein said delay means includes a first MOSFET inverter having its input coupled to said read/write input, and a MOSFET driver circuit having a switch MOSFET having its gate electrode coupled to said read/write input and its load MOSFET coupled to the output of said first MOSFET inverter, the output of said MOSFET driver being connected to said second input of said NOR gate means.

6. The memory system as recited in claim 1 further including first and second field effect transistors coupled between a voltage conductor and said first and second bit sense conductors, respectively, and having their gate electrodes coupled to said means responsive to said read/write input, in order to effect said charging of said first and second sense-write conductors.

* * * * *